(12) United States Patent
Di Cioccio et al.

(10) Patent No.: US 11,380,648 B2
(45) Date of Patent: Jul. 5, 2022

(54) PROCESS FOR MANUFACTURING ASSEMBLY PADS ON A CARRIER FOR THE SELF-ASSEMBLY OF AN ELECTRONIC CIRCUIT ON THE CARRIER

(71) Applicant: Commissariat à l'Energie Atomique et aux Energies Alternatives, Paris (FR)

(72) Inventors: Léa Di Cioccio, Saint-Ismier (FR); Jean Berthier, Meylan (FR); Nicolas Posseme, Sassenage (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 204 days.

(21) Appl. No.: 16/342,482

(22) PCT Filed: Nov. 3, 2017

(86) PCT No.: PCT/FR2017/053014
§ 371 (c)(1),
(2) Date: Apr. 16, 2019

(87) PCT Pub. No.: WO2018/083425
PCT Pub. Date: May 11, 2018

(65) Prior Publication Data
US 2019/0259729 A1 Aug. 22, 2019

(30) Foreign Application Priority Data
Nov. 3, 2016 (FR) ...................................... 1660626

(51) Int. Cl.
*H01L 21/00* (2006.01)
*H01L 23/00* (2006.01)
(Continued)

(52) U.S. Cl.
CPC ........ *H01L 24/83* (2013.01); *H01L 21/02592* (2013.01); *H01L 24/03* (2013.01);
(Continued)

(58) Field of Classification Search
CPC . H01L 2224/95085; H01L 2224/95146; H01L 24/95
See application file for complete search history.

(56) References Cited

U.S. PATENT DOCUMENTS

2009/0265929 A1* 10/2009 Nakagawa ............... H01L 24/95
29/846
2011/0229667 A1* 9/2011 Jin ...................... B81C 1/00206
216/2
(Continued)

FOREIGN PATENT DOCUMENTS

JP 2001087953 A 4/2001
WO 2016112344 A1 7/2016

OTHER PUBLICATIONS

Y. He et al., "Superhydrophobic silicon surfaces with micro-nano hierarchical structures via deep reactive ion etching and galvanic etching," Journal of Colloid and Interface Science 364 (2011), p. 219-229.

(Continued)

*Primary Examiner* — Bradley Smith
*Assistant Examiner* — David J Goodwin
(74) *Attorney, Agent, or Firm* — Moreno IP Law LLC

(57) ABSTRACT

The invention concerns a support intended for the implementation of a method of self-assembly of at least one element on a surface of the support, including at least one assembly pad on said surface, a liquid drop having a static angle of contact on the assembly pad smaller than or equal to 15°, and nanometer- or micrometer-range pillars on said
(Continued)

surface around the pad, the liquid drop having a static angle of contact on the pillars greater than or equal to 150°.

13 Claims, 5 Drawing Sheets

(51) Int. Cl.
*H01L 21/02* (2006.01)
*B82Y 30/00* (2011.01)

(52) U.S. Cl.
CPC .............. *H01L 24/09* (2013.01); *H01L 24/11* (2013.01); *H01L 24/17* (2013.01); *H01L 24/27* (2013.01); *H01L 24/29* (2013.01); *H01L 24/33* (2013.01); *H01L 24/81* (2013.01); *H01L 24/95* (2013.01); *B82Y 30/00* (2013.01); *H01L 2224/29186* (2013.01); *H01L 2224/83002* (2013.01); *H01L 2224/83026* (2013.01); *H01L 2224/83051* (2013.01); *H01L 2224/83143* (2013.01); *H01L 2224/83192* (2013.01); *H01L 2224/83203* (2013.01); *H01L 2224/83896* (2013.01); *H01L 2224/95146* (2013.01); *H01L 2924/01006* (2013.01); *H01L 2924/01009* (2013.01); *H01L 2924/01014* (2013.01); *H01L 2924/14* (2013.01)

(56) References Cited

U.S. PATENT DOCUMENTS

| | | | | |
|---|---|---|---|---|
| 2013/0298977 A1* | 11/2013 | Chen | ................. | H01L 31/02363 |
| | | | | 136/255 |
| 2014/0238645 A1* | 8/2014 | Enright | ................... | F28D 15/02 |
| | | | | 165/104.21 |
| 2014/0360252 A1* | 12/2014 | Yamamoto | .............. | B81C 3/005 |
| | | | | 73/64.48 |
| 2015/0287695 A1* | 10/2015 | Di Cioccio | ........... | H01L 23/147 |
| | | | | 438/118 |
| 2018/0166289 A1* | 6/2018 | Kim | .................. | H01L 21/02112 |

OTHER PUBLICATIONS

R. Williams et al., "Wetting of thin layers of SiO2 by water," Applied Physics Letters, vol. 25, No. 15 (1974), p. 531-532.

Search Report for International Application No. PCT/FR2017/053014 dated Mar. 6, 2018, 3 pages.

M. Atthi et al., "Increasing Active Surface Area to Fabricate Ultra-Hydrophobic Surface by Using 'Black Silicon' with Bosch Etching Process," Journal of Nanonscience and Nanotechnology, vol. 12 (2009), pp. 1-9.

Translation of the Written Opinion of the ISA for International Application No. PCT/FR2017/053014 dated Mar. 6, 2018, 7 pages.

* cited by examiner

PROCESS FOR MANUFACTURING ASSEMBLY PADS ON A CARRIER FOR THE SELF-ASSEMBLY OF AN ELECTRONIC CIRCUIT ON THE CARRIER

CROSS-REFERENCE TO RELATED APPLICATION

The present patent application claims the priority benefit of French patent application FR16/60626 which is herein incorporated by reference.

FIELD

The present invention concerns a method of manufacturing pads on a support for the implementation of a method of self-assembly of an electronic circuit onto the support.

BACKGROUND

For certain applications, an electronic circuit or a plurality of electronic circuits, for example, integrated circuits, are bonded to a support. The support for example corresponds to another integrated circuit. The bonding may be performed by molecular bonding or by thermocompression.

Before bonding the integrated circuit to the support, it is necessary to correctly place the integrated circuit with respect to the support. This may be achieved by a method of self-assembly of the integrated circuit to the support.

FIGS. 1A to 1C are partial simplified cross-section views of structures obtained at successive steps of an example of a method of self-assembly of an electronic circuit 10, for example, an integrated circuit, to a support 11, and FIGS. 2A to 2C are respective top views of the structures shown in FIGS. 1A to 1C.

Support 11 comprises a substrate 12 made of a material of low wettability, for example, silicon, and comprises, at the surface of substrate 12, a pad 14 of a material of high wettability. Support 11 may comprise a plurality of pads 14. A drop 16 of a liquid, for example demineralized water, is arranged on pad 14 (FIGS. 1A and 2A). Pad 14 may be formed by forming a silicon oxide layer on substrate 12 and by etching the obtained layer to delimit pad 14. The silicon oxide layer may have a thickness in the order of 50 nm.

Generally, the wettability of a material may be characterized by the angle $\theta$ of contact of a liquid drop on the material. The smaller the contact angle, the higher the wettability of the material. In the cross-section plane of FIG. 1A, the liquid/air interface 18 of drop 16 is in contact with pad 14 at contact points P and P'. Call T the tangent to interface 18 at contact point P (or P'). Angle $\theta$ of contact of drop 16 on pad 14 is the angle between tangent T and the surface of pad 14, the surface of pad 14 being horizontal. When drop 16 is at rest, the measured angle $\theta$ is the static contact angle.

Electronic circuit 10 is then brought closer to pad 14 to come into contact with drop 16. In this approach phase, electronic circuit 10 may be shifted and inclined with respect to pad 14 (FIGS. 1B and 2B).

The forces exerted by drop 16 on electronic circuit 10 then displace electronic circuit 10 to the desired alignment relative to pad 14 (FIGS. 1C and 2C) without for any external action to be necessary.

The method of bonding electronic circuit 10 to support 11, for example, by molecular bonding or by thermocompression, may then be implemented.

For the self-assembly method to take place properly, it is necessary for drop 16 to remain confined on pad 14 all along the alignment of electronic circuit 10 relative to support 11. In the previously-described example of self-assembly method, the confinement of drop 16 on pad 14 all along the self-assembly method is obtained by the wettability difference between pad 14 and substrate 12. The higher the wettability difference, the more drop 16 tends to remain confined on pad 14.

However, with known methods, it may be difficult to obtain a significant wettability difference between pad 14 and substrate 12. Errors in the placing of drop 16 on support 11 may then occur and drop 16 may leave pad 14 during the self-assembly process.

There thus is a need to form self-assembly pads enabling to improve the confinement of drops of liquid on a support for the implementation of a self-assembly method.

It is further desirable for the pad manufacturing method to be compatible with conventional electronic circuit manufacturing techniques.

SUMMARY

An object of the invention is to overcome all or part of the disadvantages of known supports comprising pads for the implementation of a self-assembly method and known methods of manufacturing such pads.

Another object of the present invention is to improve the confinement of liquid drops on pads of a support for the implementation of a self-assembly method.

Another object of the present invention is to increase the wettability difference between each pad and the substrate surrounding the pad.

Another object of the present invention is for the pad manufacturing method to be compatible with conventional electronic circuit manufacturing methods.

Thus, an embodiment provides a support intended for the implementation of a method of self-assembly of at least one element onto a surface of the support, comprising:

at least one assembly pad on said surface, a liquid drop having a static angle of contact on the assembly pad smaller than or equal to 15°; and nanometer- or micrometer-range pillars on said surface around the pad, the liquid drop having a static angle of contact on the pillars greater than or equal to 150°.

According to an embodiment, the pillars have a height H and a width a measured in a plane parallel to the surface, adjacent pillars being spaced apart by an interval b measured in a plane parallel to the surface. Height H, width a, and interval b verify the following relations:

$$a < \frac{b}{4}$$

$$H > b$$

$$b < \sqrt{\frac{\Gamma}{\rho g}}$$

where $\Gamma$ is equal to the surface tension of the liquid, $\rho$ is equal to the density of the liquid, and g is the gravitational constant.

According to an embodiment, each pillar comprises at least one amorphous silicon or polysilicon core.

According to an embodiment, each pillar comprises at least at its surface a fluorinated material.

According to an embodiment, the fluorinated material is a fluorocarbon material.

According to an embodiment, the support further comprises a protrusion comprising sides and a top, the assembly pad being on the top.

According to an embodiment, the sides comprise at their surface the fluorinated material.

An embodiment also provides a method of manufacturing at least one assembly pad on a support intended for the implementation of a method of self-assembly of at least one element onto a surface of the support, the manufacturing method comprising forming, on the support, nanometer- or micrometer-range pillars around the location of the assembly pad, a liquid drop having a static angle of contact on the assembly pad smaller than or equal to 15°, the liquid drop having a static angle of contact on the pillars greater than or equal to 150°.

According to an embodiment, the pillars have a height H and a width a measured in a plane parallel to the surface, adjacent pillars being spaced apart by an interval b measured in a plane parallel to the surface. Height H, width a, and interval b verify the following relations:

$$a < \frac{b}{4}$$
$$H > b$$
$$b < \sqrt{\frac{\Gamma}{\rho g}}$$

where $\Gamma$ is equal to the surface tension of the liquid, $\rho$ is equal to the density of the liquid, and g is the gravitational constant.

According to an embodiment, the method comprises depositing a layer of amorphous silicon or polysilicon on the surface and etching the amorphous silicon or polysilicon layer to form the pillars.

According to an embodiment, the method comprises depositing a porous layer on the amorphous silicon or polysilicon layer.

According to an embodiment, the pillar-forming step comprises the forming at the surface of each pillar of a layer of at least one fluorinated material.

According to an embodiment, the method comprises exposing the pillars and the location to an ultraviolet treatment in the presence of ozone to form the assembly pad at said location.

According to an embodiment, the method further comprises the steps of:
depositing a liquid drop on the assembly pad; and
bringing the element into contact with the drop, which results in a self-assembly of the element with respect to the support.

According to an embodiment, the element is an electronic circuit chip.

According to an embodiment, the method further comprises the steps of:
drying the drop; and
bonding the element to the support.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION OF THE PRESENT EMBODIMENTS

Figure 1A:
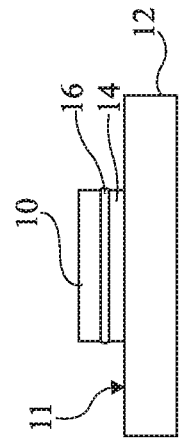
FIGS. 1A to 1C, previously described, are cross-section views of structures obtained at successive steps of an example of a self-assembly method.
Figure 1B:
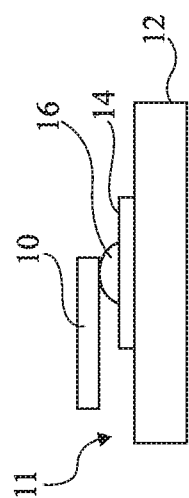
Figure 1C:
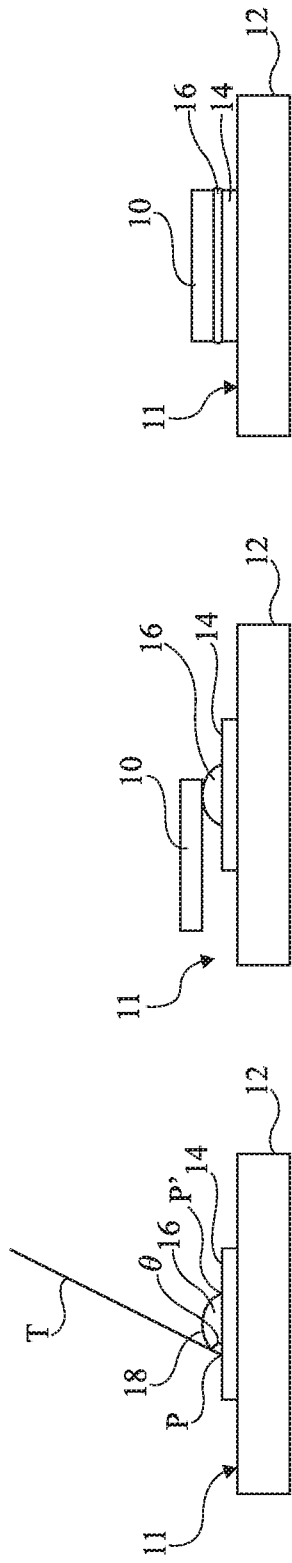
Figure 2A:
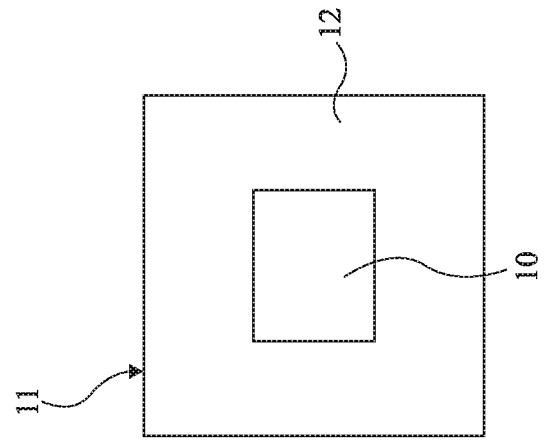
FIGS. 2A to 2C, previously described, are respective top views of FIGS. 1A to 1C.
Figure 2B:
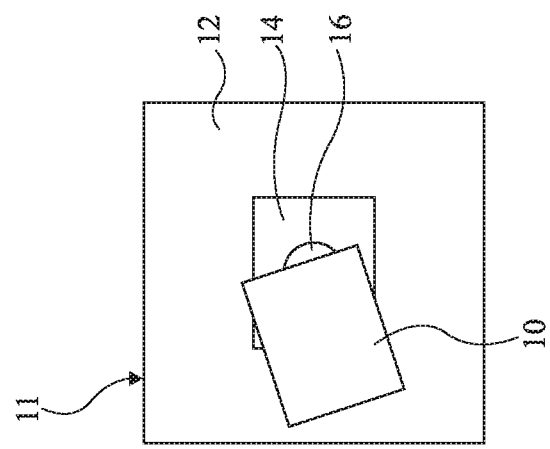
Figure 2C:
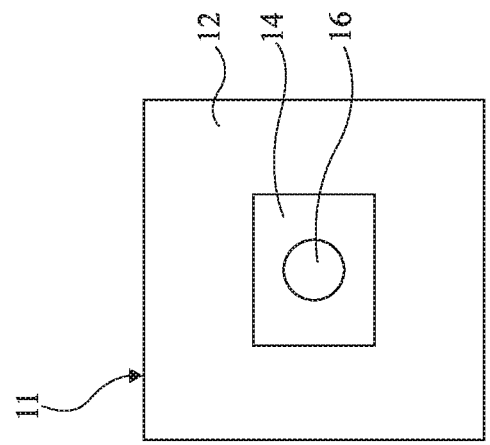

The same elements have been designated with the same reference numerals in the different drawings. For clarity, only those steps and elements which are useful to the understanding of the described embodiments have been shown and are detailed. The terms "approximately", "substantially", and "in the order of" are used herein to designate a tolerance of plus or minus 10%, preferably of plus or minus 5%, of the value in question.

In the rest of the disclosure, "hydrophilic material" designates a material for which the static angle of contact of a liquid drop on the material is smaller than 90° and "hydrophobic material" designates a material for which the static angle of contact of a liquid drop on the material is greater than 90°.

Figure 3:
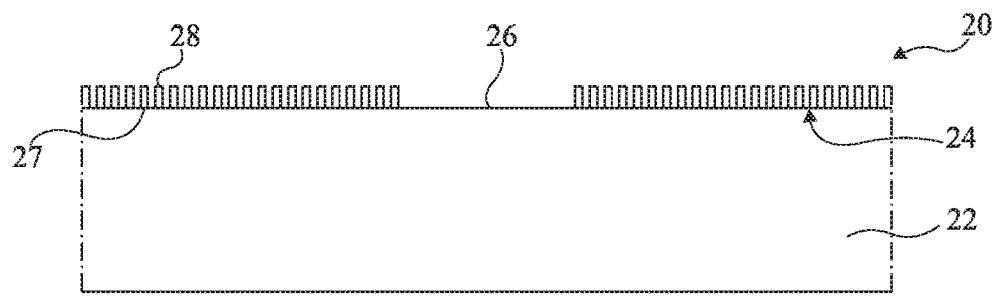
FIGS. 3 and 4 are cross-section views of embodiments of a support comprising a pad intended for the implementation of a self-assembly method.

FIG. 3 is a cross-section view of an embodiment of a support 20 having an electronic circuit, not shown, intended to be bonded thereon by a self-assembly method.

Support 20 comprises a substrate 22 having a surface 24, preferably substantially planar, and a pad 26 intended for the implementation of a self-assembly method. In the present embodiment, pad 26 corresponds to a portion of surface 24. Support 20 may comprise a plurality of pads 26. Support 20 further comprises micrometer- or nanometer-range pillars 28 arranged on a region 27 of surface 24 around pad 26.

According to the invention, pad 26 has a high wettability, the static angle of contact of a liquid drop on pad 26 being smaller than or equal to 15°, preferably smaller than or equal to 10°, more preferably smaller than or equal to 5°. As will be described in further detail hereafter, the presence of pillars 28 and their hydrophobic preparation provide a low wettability to support 20 for the portion of support 20 surrounding pad 26, the static angle of contact of a liquid drop on support 20 for the portion of support 20 surrounding pad 26 being greater than or equal to 110°, preferably greater than or equal to 130°, more preferably greater than or equal to 150°.

The measurement of the wetting angle may be performed by using the measurement device commercialized by GBX under trade name Digidrop—MCAT. The measurement comprises the deposition of a drop of demineralized water from 2 to 10 µl on a surface of the material to be studied, the acquisition of an image of the drop by an image acquisition device, and the determination of the contact angle by computer analysis of the acquired image.

Figure 4:
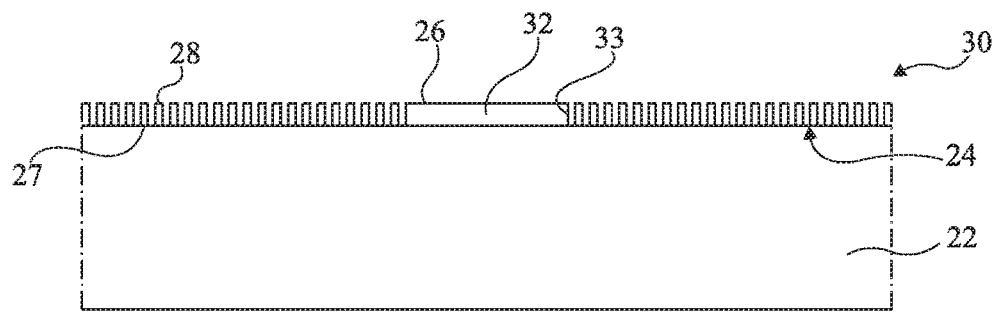

FIG. 4 is a cross-section view of another embodiment of a support 30. Support 30 comprises all the elements of support 20, with the difference that pad 26 is formed at the top of an element 32, also called protrusion, protruding with respect to surface 24. Advantageously, pad 26 may then be located at the same height as the top of pillars 28. The height of protruding element 32 may be in the range from a few micrometers to some hundred micrometers, typically, from 5 µm to 50 µm. Preferably, the height of the protruding element is substantially equal to the height of pillars 28. Protruding element 32 comprises sides 33 substantially perpendicular to surface 24. As a variation, sides 33 may be inclined with respect to surface 24 by an angle in the range from 10° to 90°, preferably from 45° to 90°.

Figure 5:
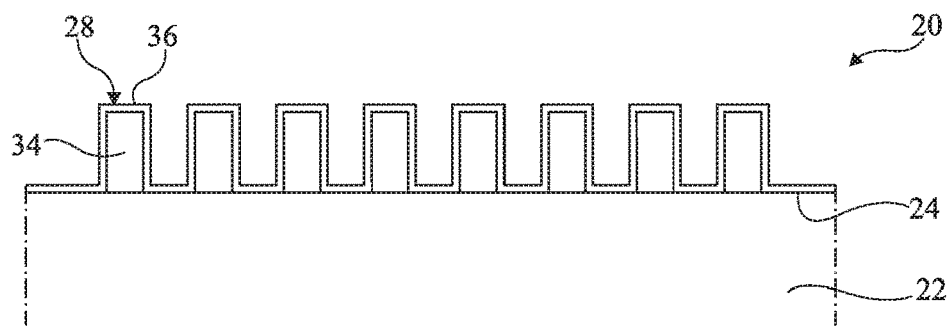
FIG. 5 is a detail view of FIG. 3 according to another embodiment of the support.

FIG. 5 is a detail view of another embodiment of support 20 or 30 where each pillar 28 comprises a core 34 covered with a layer 36 of a hydrophobic material. Hydrophobic layer 36 may also extend on surface 24 of substrate 22 except for pad 26. As a variation, pillars 28 may totally formed in the hydrophobic material.

According to an embodiment, the hydrophobic material is a fluorinated material, preferably a fluorocarbon material. As an example, hydrophobic layer 36 is based on fluorocarbon compounds of $C_xF_y$ type, where x and y are real numbers, x may vary from 1 to 5, and y may vary from 1 to 8. The thickness of hydrophobic layer 36 is for example in the range from 10 nm to 300 nm.

Figure 6:
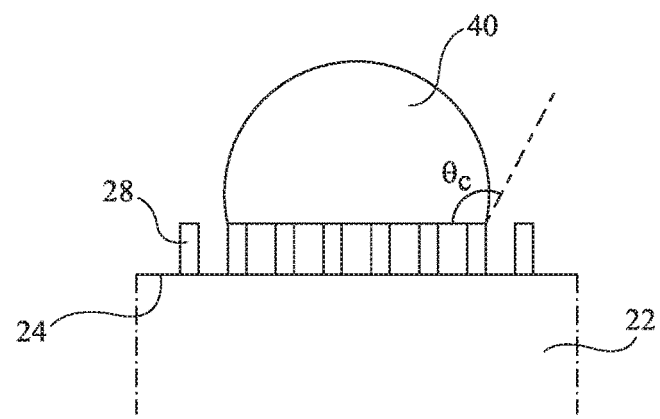
FIG. 6 is a detail view of FIG. 3 showing a liquid drop resting on the support outside of the assembly pad.
Figure 7:
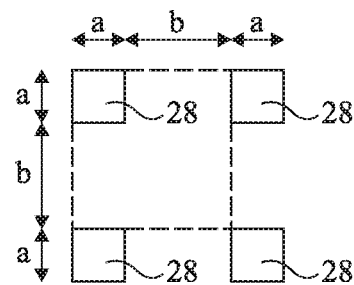
FIGS. 7 and 8 are respective top and side detail views of FIG. 3.
Figure 8:
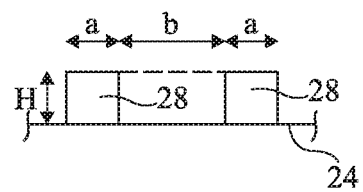

FIG. 6 is a detail view of FIG. 3 showing a liquid drop 40 resting on pillars 28 and FIGS. 7 and 8 illustrate dimensional parameters of pillars 28. Three dimensional parameters of a pillar 28 will now be described, knowing that these parameters may be identical or different from one pillar to the other.

Call height H the height of pillar 28. Preferably, pillars 28 have substantially the same height H.

The cross-section of each pillar 28 in a plane parallel to surface 24 may be substantially circular, ellipsoidal or polygonal, for example, triangular, square, or rectangular. As a variation, the cross-section of each pillar 28 in a plane parallel to surface 24 may have any shape. In the rest of the description, call width a the smallest dimension of the cross-section of pillar 28 in a plane parallel to surface 24. As an example, when pillar 28 has a circular cross-section in a plane parallel to surface 24, distance a may correspond to the diameter of the cross-section and when pillar 28 has a square cross-section in a plane parallel to surface 24, distance a may correspond to the side of the cross-section. Pillar 28 may have a generally cylindrical shape, with a cross-section of pillar 28 which substantially does not vary according to the distance to surface 24. As a variation, the cross-section of pillar 28 may vary according to the distance to surface 24. As an example, pillar 28 may have a generally conical or truncated cone shape.

Call interval b the distance separating two adjacent pillars 28 measured in a plane parallel to surface 24. Interval b between two pillars 28 may substantially not vary according to the distance to surface 24. This is particularly true when pillars 28 have a generally cylindrical shape. As a variation, interval b between two adjacent pillars 28 may vary according to the distance to surface 24. This is particularly true when pillars 28 have a generally conical or truncated cone shape. Pillars 28 are advantageously substantially regularly distributed on surface 24 outside of pad 26.

The dimensions of pillars 28 are selected so that drop 40 of liquid substantially rests on the tops of pillars 28. In particular, height H is sufficiently high and interval b is sufficiently low for a liquid drop deposited on pillars 40 not to be "impaled" on pillars 28 and not to come into contact with surface 24. This is obtained when height H and interval b respect the following relations (1):

$$H > b \tag{1}$$

$$b < \sqrt{\frac{\Gamma}{\rho g}}$$

where $$b < \sqrt{\frac{\Gamma}{\rho g}}$$

corresponds to the capillary length, that is, the radius of a drop of the considered liquid for which the surface tension energy is equal to the gravitational potential energy, "Γ" being equal to the surface tension of the considered liquid expressed in N/m, "ρ" being equal to the density of the considered liquid expressed in kg/m³, and g being the gravitational constant.

When liquid drop 40 substantially rests on the tops of pillars 28, the static contact angle $\theta_c$ of liquid drop 40 which is measured is greater than the static contact angle θ which is obtained when the liquid drop is arranged on a planar surface formed of the same material as the material at the surface of pillars 28.

There exists a plurality of laws, called Cassie laws or Cassie-Baxter laws, which couple the static contact angles $\theta_c$ and θ and which particularly depend on the relative surface area of pads 28. As an example, for pillars 28 having flat tops, static contact angles $\theta_c$ and θ are coupled by the following relation (2):

$$\cos \theta_c = -1 + f(1 + \cos \theta) \tag{2}$$

where f is the ratio, in top view, of the surface area occupied by pillars 28 in contact with drop 40 to the area of the base of drop 40.

In the case where pillars 48 are cylindrical with a square base, as shown as an example in FIGS. 7 and 8, static contact angles and are coupled by the following relation (3):

$$\cos\theta_C = -1 + \frac{a^2}{(a+b)^2}(1 + \cos\theta) \tag{3}$$

In the case where the tops of pillars 48 have a hemispherical shape, static contact angles $\theta_c$ and θ are coupled by the following relation (4):

$$\cos \theta_c = -1 + f(1 + \cos \theta)^2 \tag{4}$$

Further, in the case where the pillars have a rough material at their surface, the roughness r of this material is defined as the ratio of the real surface area of the material to the apparent surface area of the material, the apparent surface area being the surface area created by the projection of the real surface area on a plane. In the case where roughness r is greater than one, static contact angle θ in the previously indicated relations is replaced with the static contact angle θ* provided by Wenzel's relation (5):

$$\cos \theta^* = r \cos \theta \quad (5)$$

A superhydrophobic static contact angle $\theta_c$, that is, greater than 180°, is obtained as soon as dimensions a and b verify the following relation (6):

$$a < \frac{b}{4} \quad (6)$$

According to an example, width a may be equal to 250 nm, interval b may be equal to 1 μm, and height H may be greater than or equal to 1 μm. According to another example, width a may be equal to 20 nm, interval b may be equal to 80 nm, and height H may be greater than or equal to 80 nm.

FIGS. 9A to 9E are partial simplified cross-section views of structures obtained at successive steps of an embodiment of a method of manufacturing support 20 shown in FIG. 3. FIGS. 9A to 9E show a single pad 26. It should be clear that the present embodiment of the manufacturing method may be implemented to simultaneously form a plurality of pads 26.

Figure 9A:
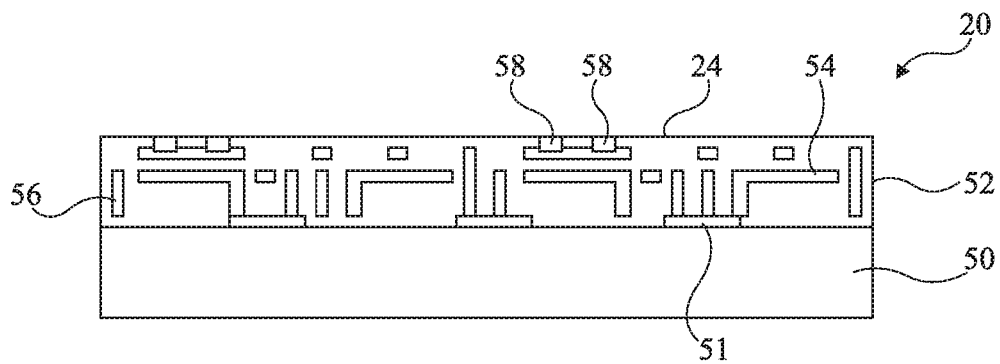
FIGS. 9A to 9E are partial simplified cross-section views of the structures obtained at successive steps of another embodiment of a method of manufacturing the support shown in FIG. 3.

FIG. 9A shows support 20. In FIGS. 9A to 9E, support 20 has been shown in the form of an electronic circuit comprising a semiconductor substrate 50 having electronic components 51 formed inside and on top of it, substrate 50 being covered with a stack 52 of insulating layers between which electrically conductive tracks 54 are formed and through which electrically conductive vias 56 are formed. Surface 24 of support 20 for example corresponds to the free surface of a layer made of an electrically-insulating material, for example, of silicon oxide. Electrically-conductive elements 58 may be flush with surface 24.

Figure 9B:
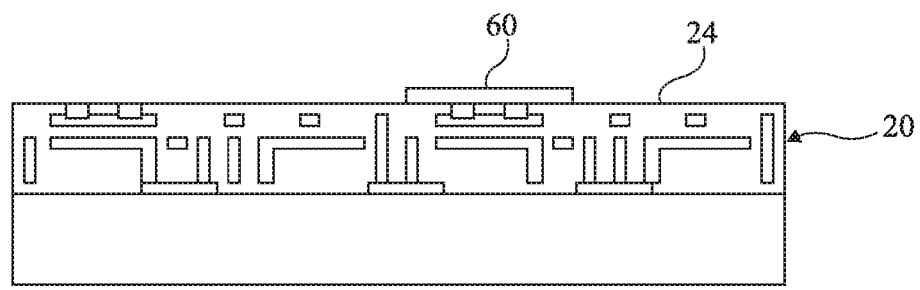

FIG. 9B shows the structure obtained after the deposition of a portion 60 of resist on surface 24. As an example, the thickness of resist portion 60 may be in the range from 500 nm to 3 μm, for example, in the order of 2.5 μm. The silicon oxide layer which delimits surface 24 particularly eases the bonding of the resist. The deposition of resist portion 60 may be performed by convention photolithography steps comprising:

depositing a resist layer all over surface 24;

exposing the resist layer to a radiation through a mask to copy in the resist layer patterns of the mask defining the contour of portion 60; and dissolving a portion of the resist layer to delimit portion 60.

The resist may be a "positive" resist. The resist portion exposed to the radiation then becomes soluble in a specific aqueous or organic solution, called developer solution, and the non-exposed resist portion remains non-soluble in the developer solution. The resin may be a "negative" resist. The resist portion exposed to the radiation then becomes non-soluble in the developer solution and the non-exposed resist portion remains soluble in the developer solution.

Examples of resist comprise the following compounds:

phenolformaldehyde, for example, a mixture of diazonaphtoquinone (or DNQ) and of a novolack resin (phenolformaldehyde resin);

polyhydroxystyrene;

poly(methyl methacrylate) or PMMA;

poly(methyl glutarimide) or PMGI; and epoxy-based polymer (for example, the resin sold under trade name SU-8 by Microchem).

Figure 9C:
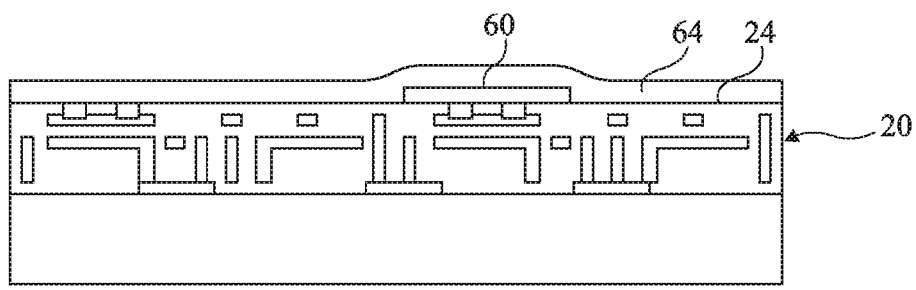

FIG. 9C shows the structure obtained after the deposition of a layer 64 of amorphous silicon or polysilicon. Advantageously, the deposition is carried out at a temperature compatible with the resist, for example, at a temperature lower than 300° C. Layer 64 may be deposited by physical vapor deposition or PVD methods. Preferably, the thickness of layer 64 is substantially equal to the height H desired for pillars 28.

Figure 9D:
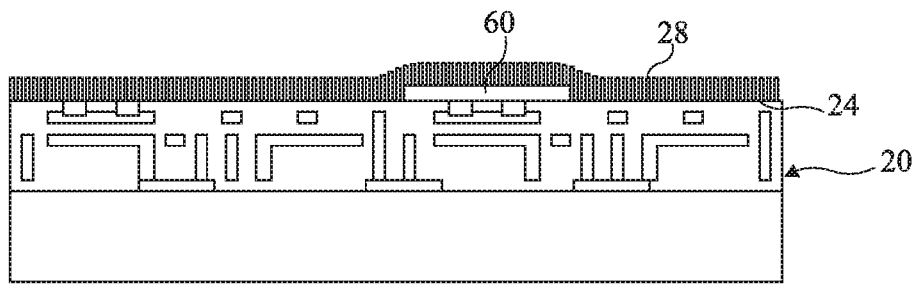

FIG. 9D shows the structure obtained after the forming of pillars 28 in layer 64. Pillars 28 may be obtained by the implementation of methods similar to those used to obtain black silicon from a single crystal silicon layer.

This may be obtained by etching of layer 64 in etching conditions causing the forming of pillars 28. According to an embodiment, the etching is performed in an etching reactor, for example, an inductively coupled plasma (ICP) reactor. The etching may be a reactive ion etching or RIE. The etching may be performed by using a fluorinated etching gas, for example, sulfur hexafluoride ($SF_6$) or nitrogen trifluoride ($NF_3$), and an oxidizing gas, for example, oxygen ($O_2$). A dilution gas, for example, argon (Ar), helium (He), or hydrogen bromide (HBr) may be provided. The ratio F/O of the fluorinated etching gas to the oxidizing gas is selected to obtain the forming of pillars 28 with the desired dimensions. The temperature in the etching reactor is preferably lower than 60° C. The pressure in the reactor may be in the range from 1.3 Pa (approximately 10 mTorr) to 8 Pa (approximately 60 mTorr). The reactor used may be an ICP reactor with a source power in the range from 1,000 W to 2,000 W and a bias power in the range from 100 W to 400 W. The duration of the etch operation may be in the range from 100 s to 1,000 s.

The height H of pillars 28 depends on the etch depth and thus on the duration of the etching process. Height H may be increased by increasing the duration of the etch step. Width a may be increased by increasing the proportion of the oxidizing gas and thus by decreasing ratio F/O. Interval b may be increased by increasing the proportion of the fluorinated etching gas and thus by increasing ratio F/O.

Amorphous silicon or polysilicon layer 64 may be covered with a layer of silicon oxide, called native oxide, which automatically forms at the surface of silicon in the presence of oxygen. The step of etching amorphous silicon or polysilicon layer 64 may then be preceded by a step of etching the native oxide layer. The etching of the native oxide may be an etching implementing a plasma made up of argon or of carbon tetrafluoride ($CF_4$). The pressure in the reactor may be in the range from 5 mTorr (approximately 0.7 Pa) to 20 mTorr (2.7 Pa). The reactor used may be an ICP reactor with a source power in the range from 100 W to 300 W and a bias power in the range from 50 W to 400 W. The duration of the etch operation may be a few seconds.

According to another embodiment, the step of forming pillars 28 comprises the deposition, on amorphous silicon or polysilicon layer 64, of a layer of a porous material, for example, silicon oxycarbide (SiOC). The deposition may be a plasma-enhanced chemical vapor deposition or PECVD formed for example at a 350° temperature, followed by an anneal using a source of an ultraviolet radiation.

The step of deposition of the layer of porous material is followed by a step of etching of the porous material layer and of the amorphous silicon or polysilicon layer. The porosity of the layer of porous material results in holes emerging at the surface. Upon etching, the relief at the surface of the layer of porous material is transferred onto amorphous silicon or polysilicon layer 64, which causes the forming of pillars 28. The etching may be a fluorinated etching.

After the step of etching pillars 28, an embodiment of the manufacturing method may comprise depositing hydrophobic layer 36 all over the structure shown in FIG. 9D to obtain the structure of pillars 28 shown in FIG. 5. Advantageously, hydrophobic layer 36 is conformally deposited.

The deposition of hydrophobic layer 36 may be performed by placing the structure shown in FIG. 9B in a passivation plasma formed from octafluorobutene ($C_3F_8$), hexafluoro-ethane ($C_2F_6$), carbon tetrafluoride ($CF_4$), and/or trifluoro-methane ($CHF_3$). The duration of exposure of the structure shown in FIG. 9D to the plasma may be in the range from 3 to 30 seconds.

As an example, gases $C_4F_8$, $C_2F_6$, $CF_4$, and/or $CHF_3$ may be introduced into the chamber of a reactor. A plasma is then formed at ambient temperature, for example, at approximately 20° C., by applying a radio frequency current adapted to the chamber. The pressure in the reactor chamber is for example from 10 Pa to 100 Pa. The plasma made up of the $C_4F_8$, $C_2F_6$, $CF_4$, and/or $CHF_3$ gas may be formed in an ICP reactor with a radio frequency generator.

Figure 9E:
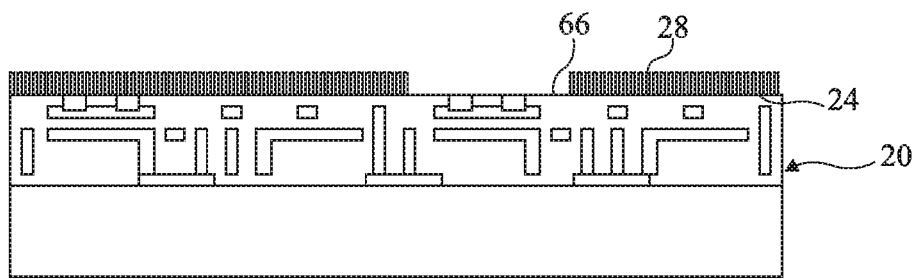

FIG. 9E shows the structure obtained after the removal of resist portion 60 to expose portion 66 of surface 24 which used to be covered with resist portion 60. The removal step may be carried out by placing the structure obtained at step 9D in a bath of a solvent capable of dissolving resin. The duration of the treatment in the bath is for example in the range from 40 seconds to 1 minute. The solvent is for example acetone or N-methyl-2-pyrrolidone. Advantageously, ultrasounds are applied to support 20 during its immersion in the bath. As an example, the frequency of the ultrasounds is in the range from 45 kHz to 47 kHz.

According to an embodiment, the method further comprises a treatment causing an increase in the wettability of portion 66 exposed to form the pad 26 of high wettability intended for the implementation of a self-assembly method. The treatment comprises exposing the entire structure shown in FIG. 9E to an ultraviolet radiation in the presence of ozone. The ultraviolet radiation comprises a first ultraviolet radiation at a first wavelength in the range from 182 nm to 187 nm, for example, in the order of 184.9 nm, and a second ultraviolet radiation at a second wavelength in the range from 250 nm to 255 nm, for example, in the order of 253.7 nm. The first radiation particularly enables to alter the hydrocarbon compounds present on portion 66. The second radiation particularly enables to form active radicals from the ozone, the active radicals reacting with the hydrocarbon compounds to form volatile compounds which are discharged. The treatment may be implemented at a temperature in the order of 80° C. in an enclosure initially containing ozone. The UV treatment may be carried out at the atmospheric pressure.

Advantageously, pads 26 of high wettability are formed after the regions of low wettability surrounding pads 26. The method of manufacturing the regions of low wettability thus does not cause a decrease in the wettability of the pads of high wettability. Further, the method of manufacturing the pads of high wettability causes no increase in the wettability of the already-formed regions of low wettability. For this purpose, advantageously, pillars 28 comprise at their surface a layer 36 of a fluorinated material, preferably a fluorocarbon material. Indeed, the inventors have shown that the layer of the fluorinated material, preferably the fluorocarbon material, keeps a low wettability even after the treatment by ultraviolet radiation in the presence of ozone has been applied thereto.

Figure 10A:
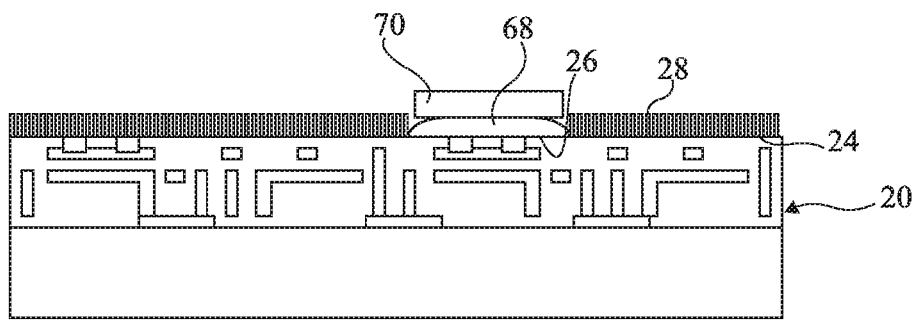
FIGS. 10A and 10B are partial simplified cross-section views of the structures obtained at successive steps of another embodiment of a self-assembly method implementing the support of FIG. 3.
Figure 10B:
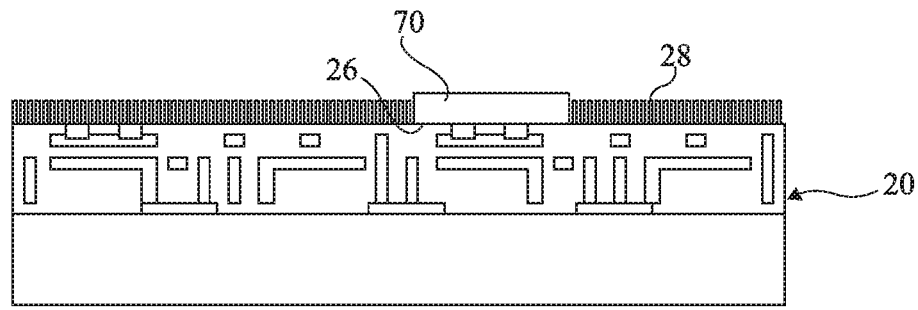

FIGS. 10A and 10B are partial simplified cross-section views of structures obtained at successive steps of an embodiment of a self-assembly method implementing support 20, for example such as obtained by the implementation of the steps illustrated in FIGS. 9A to 9E.

FIG. 10A shows the structure obtained after the deposition of water on support 20 which has coalesced to form a water drop 68 on pad 26 and the placing of an electronic circuit 70, for example, an integrated circuit chip, in contact with water drop 68. The forces exerted by drop 68 on electronic circuit 70 then displace electronic circuit 70 to the desired alignment with respect to pad 26. The deposition of water on support 20 may be performed by spraying.

FIG. 10B shows the structure obtained after the bonding of electronic circuit 70 to support 20. The bonding may be performed by molecular bonding or by thermocompression.

The method may comprise a subsequent step of removal of pillars 28. This may be achieved by an etching operation stopping on surface 24.

Figure 11A:
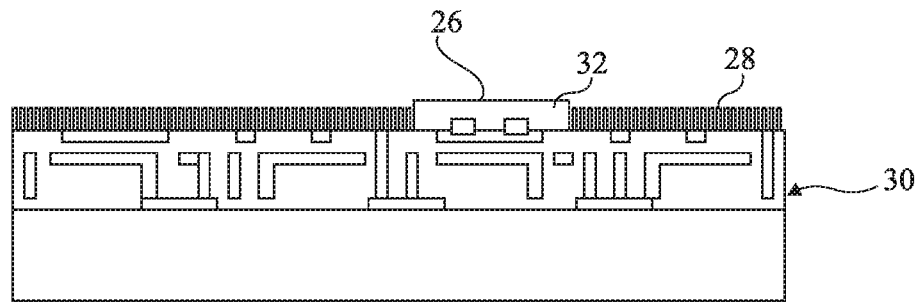
FIGS. 11A and 11B are partial simplified cross-section views of structures obtained at successive steps of an embodiment of a method of manufacturing the support shown in FIG. 4 and of a self-assembly method implementing the support of FIG. 4.

FIG. 11A is a partial simplified cross-section view of the structure obtained at a step of an embodiment of a method of manufacturing the support shown in FIG. 4. The present embodiment of the manufacturing method comprises all the steps previously described in relation with FIGS. 9A to 9E, with the difference that it comprises a step of forming element 32 protruding with respect to surface 24, which may be implemented after the forming of resist portion 60. Protruding element 32 may be formed by an anisotropic etch step, resist portion 60 playing the role of an etch mask. It may be a deep reactive ion etching or DRIE. The etching gas may be sulfur hexafluoride ($SF_6$). It may be a deep reactive ion etching or DRIE. A $SF_6/O_2$ mixture or a BOSCH-type method alternating steps of plasma deposition of a polymerizing $C_xH_yF_z$ gas and steps of etching, for example with $SF_6$, is for example used for this purpose.

Figure 11B:
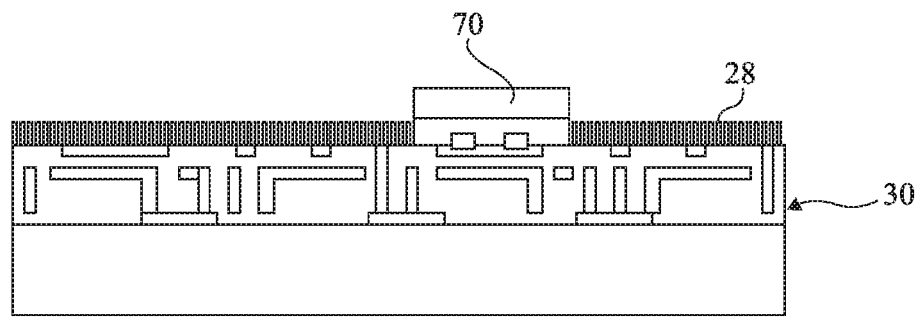

FIG. 11B is a partial simplified cross-section view of the structure obtained at a step of an embodiment of a method of self-assembly implementing the support of FIG. 4. The forming of pad 26 at the top of protruding element 32 enables to benefit from, in addition to the wettability difference between pad 26 and region 27 surrounding the pad, an effect, called canthotaxis, of anchoring of the drop on the top of protruding element 32 to keep the drop confined on pad 26.

The manufacturing method according to the invention is particularly adapted in the case where the bonding of electronic circuit 70 to support 20 or 30, which is formed after the self-assembly, is performed by molecular bonding. Indeed, for this type of bonding, it is necessary to provide surfaces having an adapted roughness. The previously-described examples of manufacturing methods provide pads 26 having a RMS height for example in the range from 0.2 nm to 0.5 nm (measured on a measurement surface area of 1 µm$^2$), that is, adapted to a molecular bonding method. Further, since portion 26 has a high wettability, it is adapted to the forming of a hydrophilic molecular bonding.

In the previously-described embodiments, layer 64 is an amorphous silicon or polysilicon layer which is etched to form pillars 28. According to another embodiment, layer 64 is replaced with a layer of a semiconductor material or of another type of material which is etched, for example, by photolithography techniques, through a mask to form pillars 28.

Specific embodiments of the present invention have been described. Various alterations, modifications, and improvements will occur to those skilled in the art. In particular, in the previously-described embodiments, support 20 corresponds to an electronic circuit. As a variation, support 20 may be a glass substrate or a metal substrate.

What is claimed is:

1. A method of self-assembly of an element onto a surface of a support comprising the steps of:
    providing a support comprising:
       at least one assembly pad on said surface; and
       nanometer- or micrometer-range pillars on said surface around the at least one assembly pad, each nanometer- or micrometer-range pillar comprising at least one cylindrical or truncated cone amorphous silicon or polysilicon core;
    depositing a drop of a liquid on the at least one assembly pad, the liquid drop having a static angle of contact on the at least one assembly pad smaller than or equal to 15°, the liquid drop having a static angle of contact on the nanometer- or micrometer-range pillars greater than or equal to 150°; and
    bringing the element into contact with the drop, which results in a self-assembly of the element with respect to the support.

2. The method of claim 1, wherein the nanometer- or micrometer-range pillars have a height H and a width a measured in a plane parallel to the surface, wherein adjacent nanometer- or micrometer-range pillars are spaced apart by an interval b measured in a plane parallel to the surface and wherein height H, width a, and interval b verify the following relations:

$$a < \frac{b}{4}$$
$$H > b$$
$$b < \sqrt{\frac{\Gamma}{\rho g}}$$

where $\Gamma$ is equal to the surface tension of the liquid, p is equal to the density of the liquid, and g is the gravitational constant.

3. The method of claim 1, wherein each nanometer- or micrometer-range pillar comprises at least at its surface a fluorinated material.

4. The method of claim 3, wherein the fluorinated material is a fluorocarbon material.

5. The method of claim 1, further comprising a protrusion comprising sides and a top, the at least one assembly pad being on the top.

6. The method of claim 5, wherein each nanometer- or micrometer-range pillar comprises at least at its surface a fluorinated material and wherein the sides comprise at their surface the fluorinated material.

7. The method of claim 1, wherein the step of providing the support comprises the forming, on the support, of the nanometer- or micrometer-range pillars around a location of the at least one assembly pad, a liquid drop having a static angle of contact on the at least one assembly pad smaller than or equal to 15°, the liquid drop having a static angle of contact on the nanometer- or micrometer-range pillars greater than or equal to 150°.

8. The method of claim 7, comprising depositing an amorphous silicon or polysilicon layer on the surface and etching the amorphous silicon or polysilicon layer to form the nanometer- or micrometer-range pillars.

9. The method of claim 8, comprising depositing a porous layer on the amorphous silicon or polysilicon layer.

10. The method of claim 7, wherein the step of forming the nanometer- or micrometer-range pillars comprises forming at the surface of each nanometer- or micrometer-range pillar a layer of at least one fluorinated material.

11. The method of claim 7, comprising exposing the nanometer- or micrometer-range pillars and the location to an ultraviolet treatment in the presence of ozone to form the at least one assembly pad at said location.

12. The method of claim 1, wherein the element is an electronic circuit chip.

13. The method of claim 1, further comprising the steps of:
    drying the drop; and
    bonding the element to the support.

* * * * *